(12) United States Patent
Liu et al.

(10) Patent No.: US 8,416,002 B2
(45) Date of Patent: Apr. 9, 2013

(54) FLIP-FLOP CIRCUIT DESIGN

(75) Inventors: Chi-Lin Liu, Yonghe (TW); Chung-Cheng Chou, Hsin-Chu (TW); Yi-Tzu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 114 days.

(21) Appl. No.: 12/908,602

(22) Filed: Oct. 20, 2010

(65) Prior Publication Data

US 2012/0098582 A1  Apr. 26, 2012

(51) Int. Cl.
*H03K 3/356* (2006.01)
(52) U.S. Cl. ......... 327/211; 327/199; 327/208; 327/218
(58) Field of Classification Search .......... 327/199–203, 327/208, 210, 211, 212, 215, 218, 219
See application file for complete search history.

(56) References Cited

U.S. PATENT DOCUMENTS

| | | | |
|---|---|---|---|
| 5,933,038 A * | 8/1999 | Klass | 327/208 |
| 2009/0039936 A1 * | 2/2009 | Kim | 327/202 |

OTHER PUBLICATIONS

Nedovic, N., et al., "Dynamic Flip-Flop with Improved Power," IEEE, 2000, pp. 323-326.
Nedovic, N., et al., "A Clock Skew Absorbing Flip-Flop," IEEE International Solid-State Circuits Conference, Session 19, Processor Building Blocks, Paper 19.5, Feb. 12, 2003, 10 pages.

* cited by examiner

*Primary Examiner* — Long Nguyen
(74) *Attorney, Agent, or Firm* — Slater & Matsil, L.L.P.

(57) ABSTRACT

A flip-flop circuit includes a precharge circuit that outputs a charge signal high when a received clock signal is LOW. A delay clock input circuit generates a delayed clock input controlled signal with the same value as an input signal when the clock signal is HIGH. A charge keeper circuit, upon receiving the charge signal and the delayed clock input controlled signal, generates a charge keeping signal, which equals the charged signal when the clock signal is LOW and equals the delayed clock input controlled signal when the clock signal is HIGH. A separator circuit can receive the charge keeping signal and clock signal and generate an inverted charge keeping signal. A storage circuit is configured to receive the inverted charge keeping signal, a present state signal, and inverted present state signal, and to generate a present state signal and an inverted present state signal.

22 Claims, 11 Drawing Sheets

Figure 4 – 130 delayed clocked input

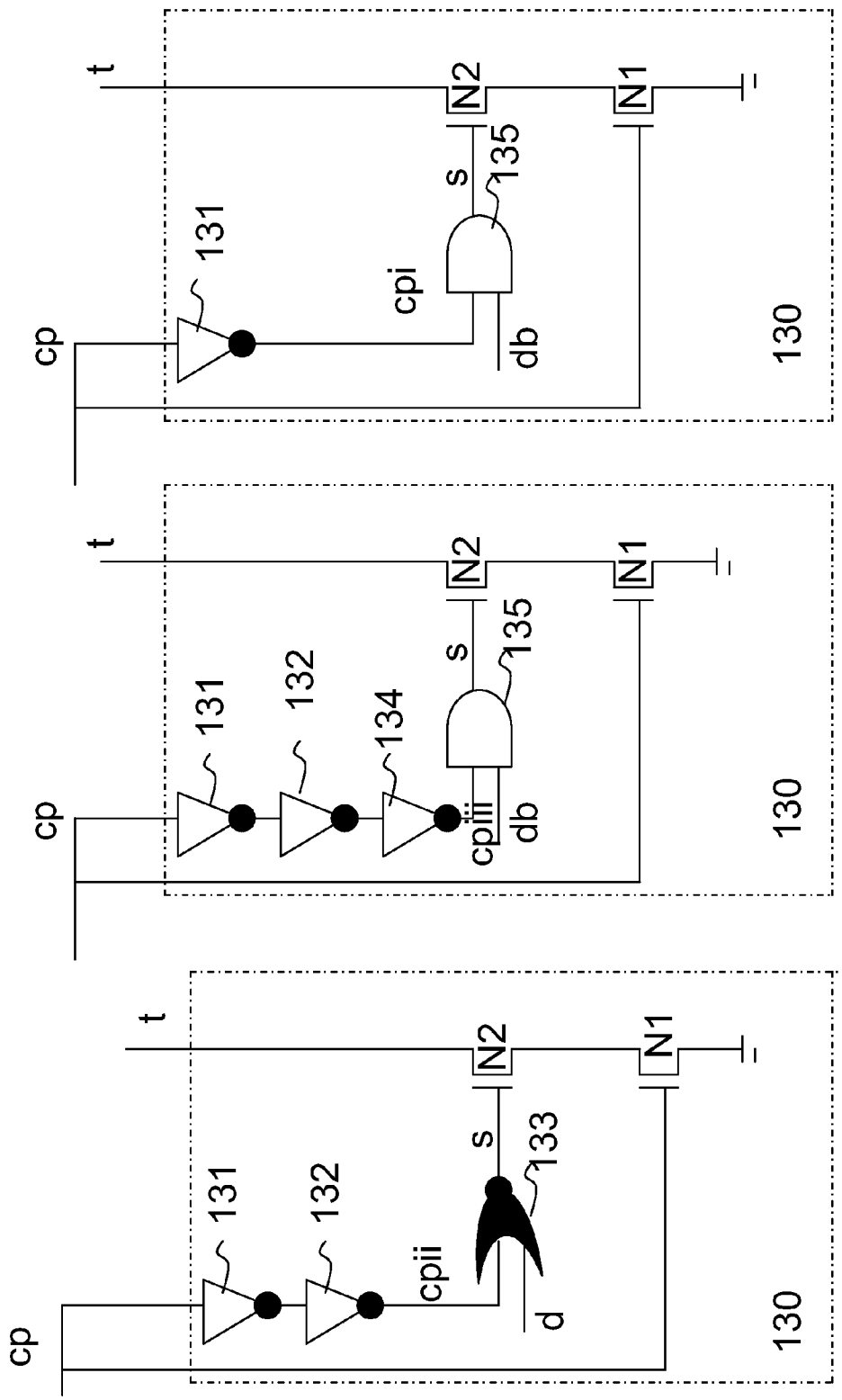
Figure 4 – 130 delayed clocked input

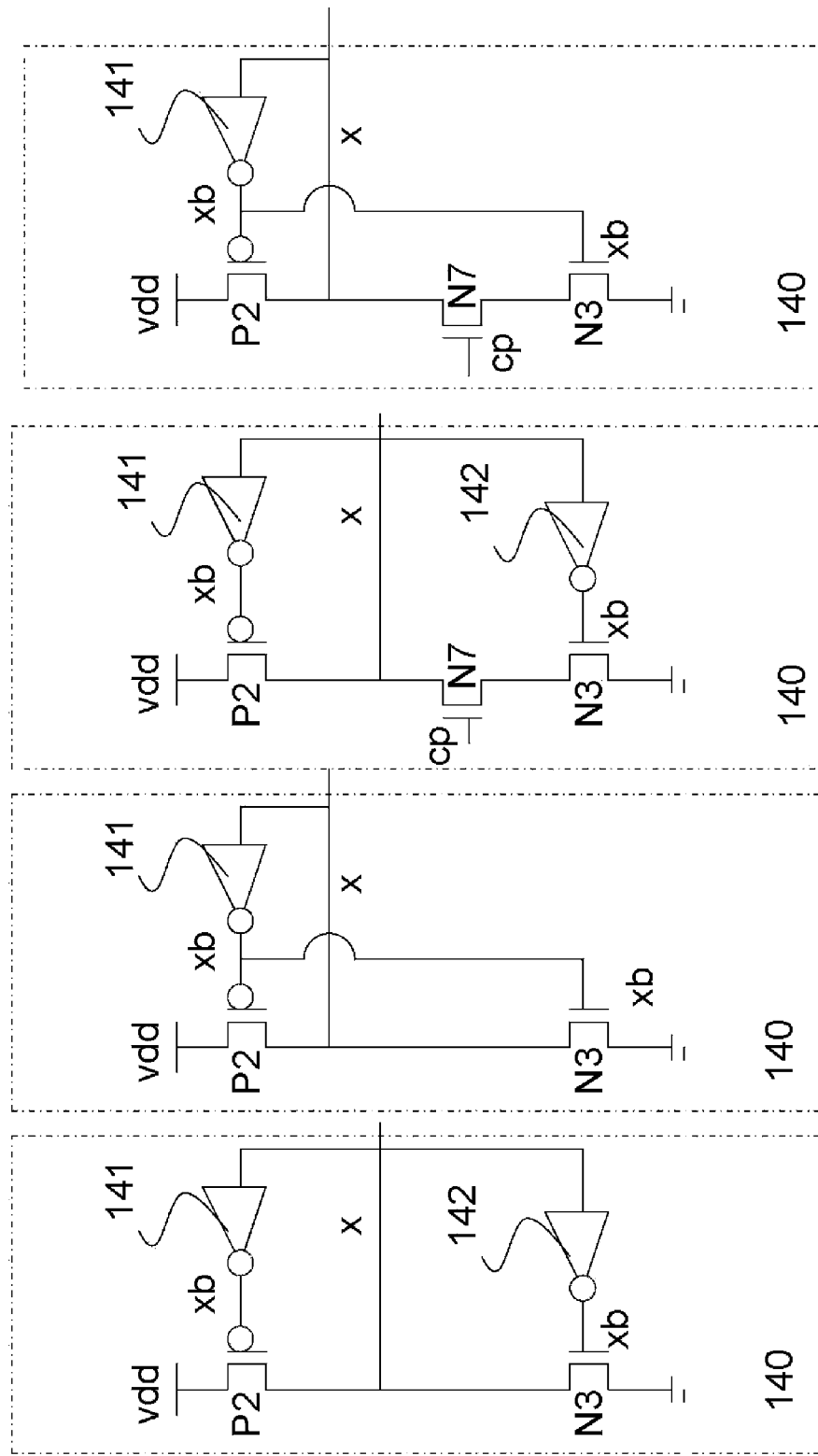
Figure 5 140 charge keeper

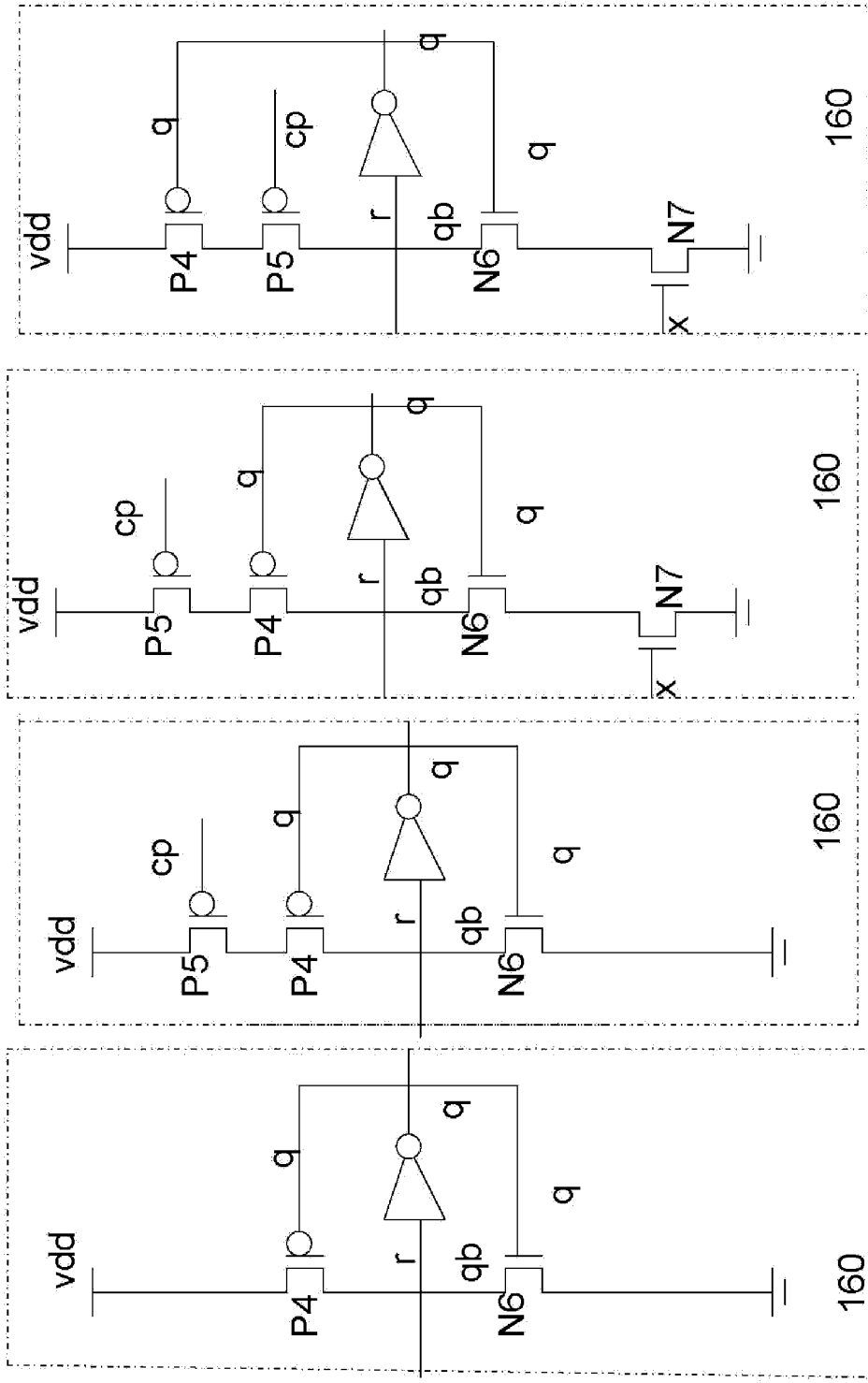
Figure 6 160 storage

US 8,416,002 B2

FLIP-FLOP CIRCUIT DESIGN

TECHNICAL FIELD

The present disclosure relates generally to logic circuits and more particularly, to flip-flop circuits.

BACKGROUND

In logic circuits, a flip-flop is a term referring to an electronic circuit that has two stable states and thereby is capable of serving as one bit of memory. A flip-flop is usually controlled by one or two control signals and/or a gate or clock signal. The output often includes the complement as well as the normal output. Flip-flops can be either simple (transparent) or clocked (or non-transparent). Clocked flip-flops are specially designed for synchronous (time-discrete) systems and typically implemented as master-slave devices. Flip-flops can be further divided into types: the RS ("set-reset"), D ("data" or "delay"), T ("toggle"), and JK types are the common ones. The D flip-flop is known as delay flip-flop (as its output Q looks like a delay of input D) or data latch. The behavior of a particular type flip-flop can be described by what is termed the characteristic equation, which derives the "present state" output in terms of the input signal(s) and/or the "previous state" signal of the flip-flops.

The metal-oxide-semiconductor field-effect transistor (MOSFET, MOS-FET, or MOS FET) is a device used for amplifying or switching electronic signals. It is made of a solid piece of semiconductor material. The four terminals of the MOS FET are named source, gate, drain, and body (substrate). In MOSFETs, a voltage on the oxide-insulated gate electrode can induce a conducting channel between the two other contacts called source and drain, when the transistor is turned ON. The channel can be of n-type or p-type, and is accordingly called an nMOSFET or a pMOSFET (also commonly nMOS, pMOS). When there is no conducting channel between the source and the drain, when the transistor is turned OFF, the source and the drain will maintain their voltage levels. The detailed operations of nMOS and pMOS transistors are known to those of skill in the art.

A signal is a digital signal that can have value 0 (LOW voltage) or 1 (HIGH voltage). Logic value 0 and LOW voltage will be used interchangeably for illustration purpose only. The embodiments may well function if the correspondence of voltage level and logic value is changed. For any signal x, the notion xb refers to the complement or inverted signal of x. For a signal x, its complement signal or inverted signal xb has value 0 if x has value 1, and xb has value 1 if x has value 0.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4(a)-4(f) depict illustrative embodiments of the delayed clocked input circuit;

FIGS. 5(a)-5(d) depict illustrative embodiments of the charge keeper circuit;

FIGS. 6(a)-6(d) depict illustrative embodiments of the storage circuit;

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Illustrative embodiments will be discussed with respect to a flip-flop design, which are implemented using nMOS transistors, pMOS transistors, invertors, and other basic logic circuits. Those of skill in the art will readily recognize that there are many variations which implement equivalent functions and the illustrative embodiments are made for illustrative purpose only.

Figure 1:
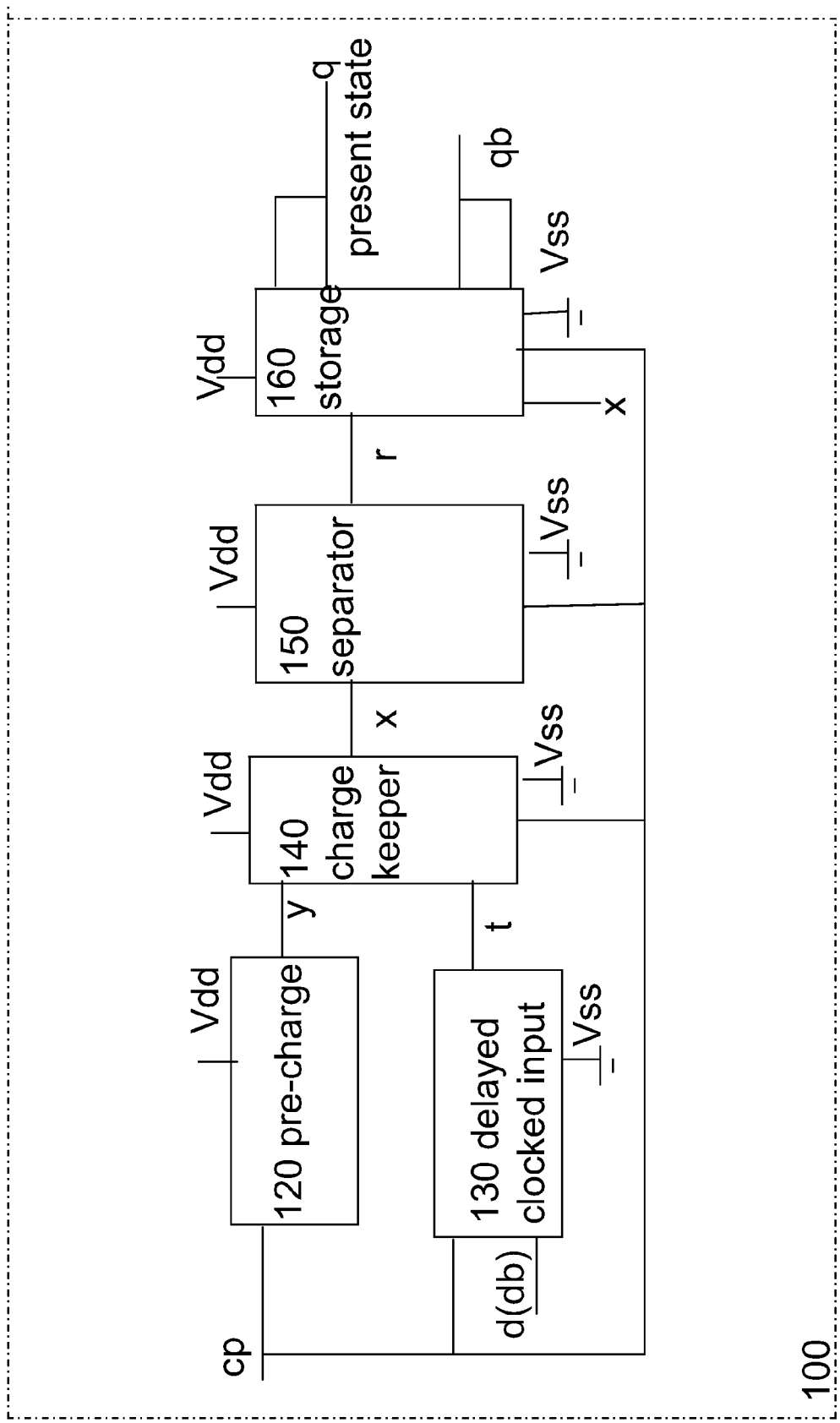
FIG. 1 depicts an illustrative block diagram of an embodiment of a flip-flop circuit 100.

FIG. 1 illustrates a block diagram of an illustrative embodiment of a flip-flop circuit 100. A clock signal cp is connected to a pre-charge circuit 120, a delayed clocked input circuit 130, a separator circuit 150, and is optionally connected to a charge keeper circuit 140 and a storage circuit 160. The pre-charge circuit 120 receives the clock signal cp, is connected to a power supply Vdd, and generates a charged signal y. The delayed clocked input circuit 130 receives the clock signal cp, and an input signal d, is connected to a ground signal Vss, and generates a delayed clocked input controlled signal t. The charge keeper circuit 140 receives the charged signal y and the delayed clocked input controlled signal t, is further connected to the power supply Vdd and the ground signal Vss, and generates a charge keeping signal x. The separator circuit 150 receives the charge keeping signal x, the clock signal cp, the power supply and the ground signals, and selectively generate an inverted charge keeping signal r. Finally, the storage circuit 160 receives the inverted charge keeping signal r, optionally receives the charge keeping signal x, and generates the present state signal q and the inverted present state signal qb, which latter two signals are feedback as inputs to storage circuit 160. Furthermore, the charged signal y, the delayed clocked input controlled signal t, and the charge keeping signal x are all coupled together, (as shown in FIG. 3), so that the value of the charge keeping signal x is either equal to the value of the charge signal y which is charged by the pre-charge circuit 120 when the clock is LOW, or the value of the delayed clocked input controlled signal t, which is controlled by the input signal d and has the same value as the input signal d when the clock is HIGH.

Figure 2:
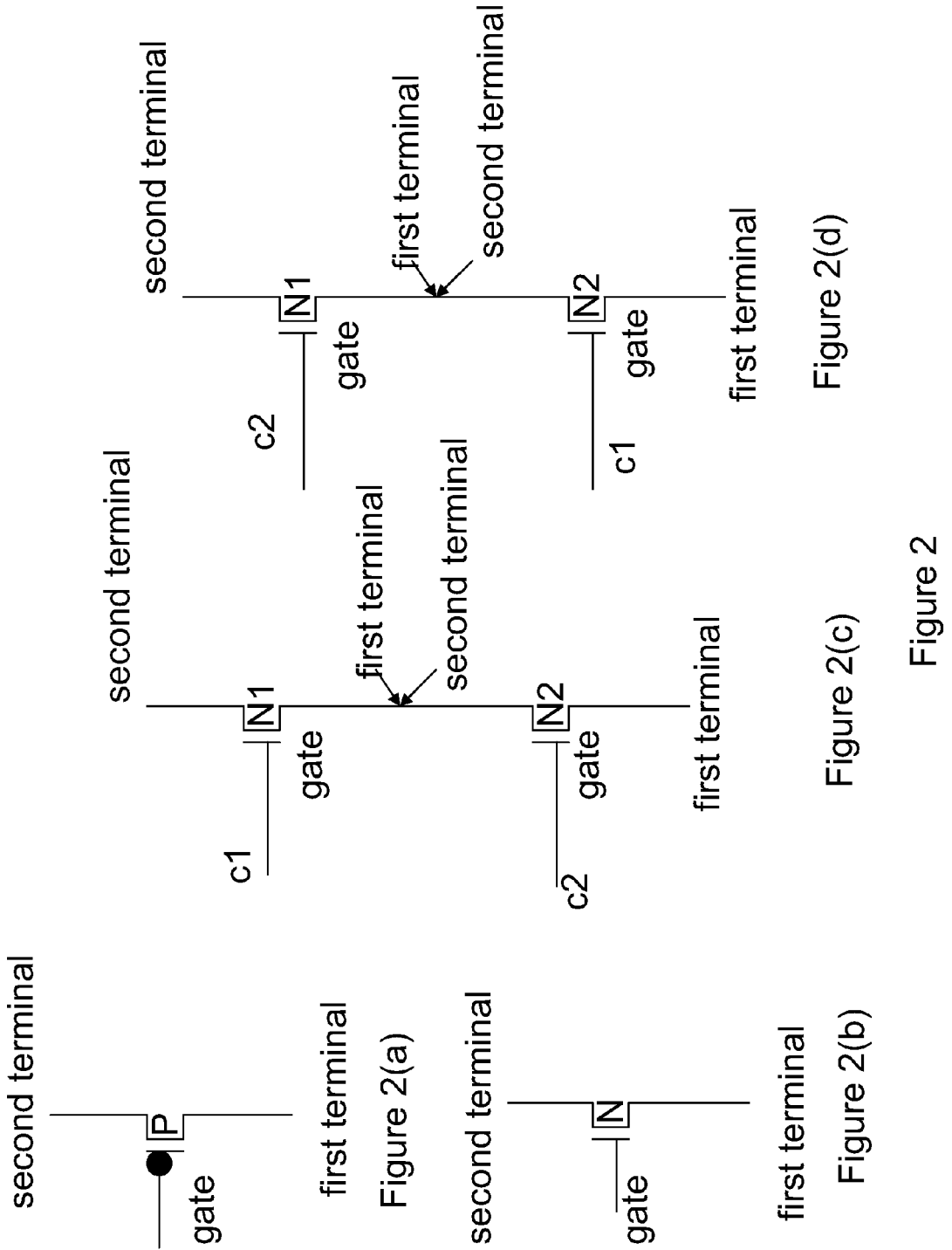
FIGS. 2(a)-2(d) depict an illustrative structure of nMOS transistors and pMOS transistors, and how transistors are coupled together in sequence.

FIG. 2 illustrates transistors and connections of transistors. A pMOS transistor is shown in FIG. 2(a) and an nMOS transistor is shown in FIG. 2(b). A first terminal of a pMOS or an nMOS transistor can be its drain or the source, while a second terminal of the pMOS or the nMOS transistor would be the source or the drain. A voltage on the gate electrode of a pMOS or an nMOS transistor can induce a conducting channel between the source and drain, or between a first terminal and a second terminal of the transistor. Two transistors can be connected in a sequence by coupling a second terminal of a first transistor to a first terminal of a second transistor, as shown in FIG. 2(c) where two nMOS transistors are connected in a sequence. Two pMOS transistors or an nMOS and a pMOS transistor can be connected in a sequence similarly. When two transistors are connected in a sequence, sometimes the function they perform does not change when the gate control signals are interchanged. For example, the function performed by the circuit in FIG. 2(c) can be the same as the function performed by the circuit in FIG. 2(d), while the control for the transistor N1 is c1 and c2 for N2 in FIG. 2(c), and the control for the transistor N1 is c2 and c1 for N2 in FIG. 2(d). Those of skill in the art can readily recognize when the function of a circuit is not affected by such interchange of gate control signals for two transistors connected in a sequence.

Figure 3:
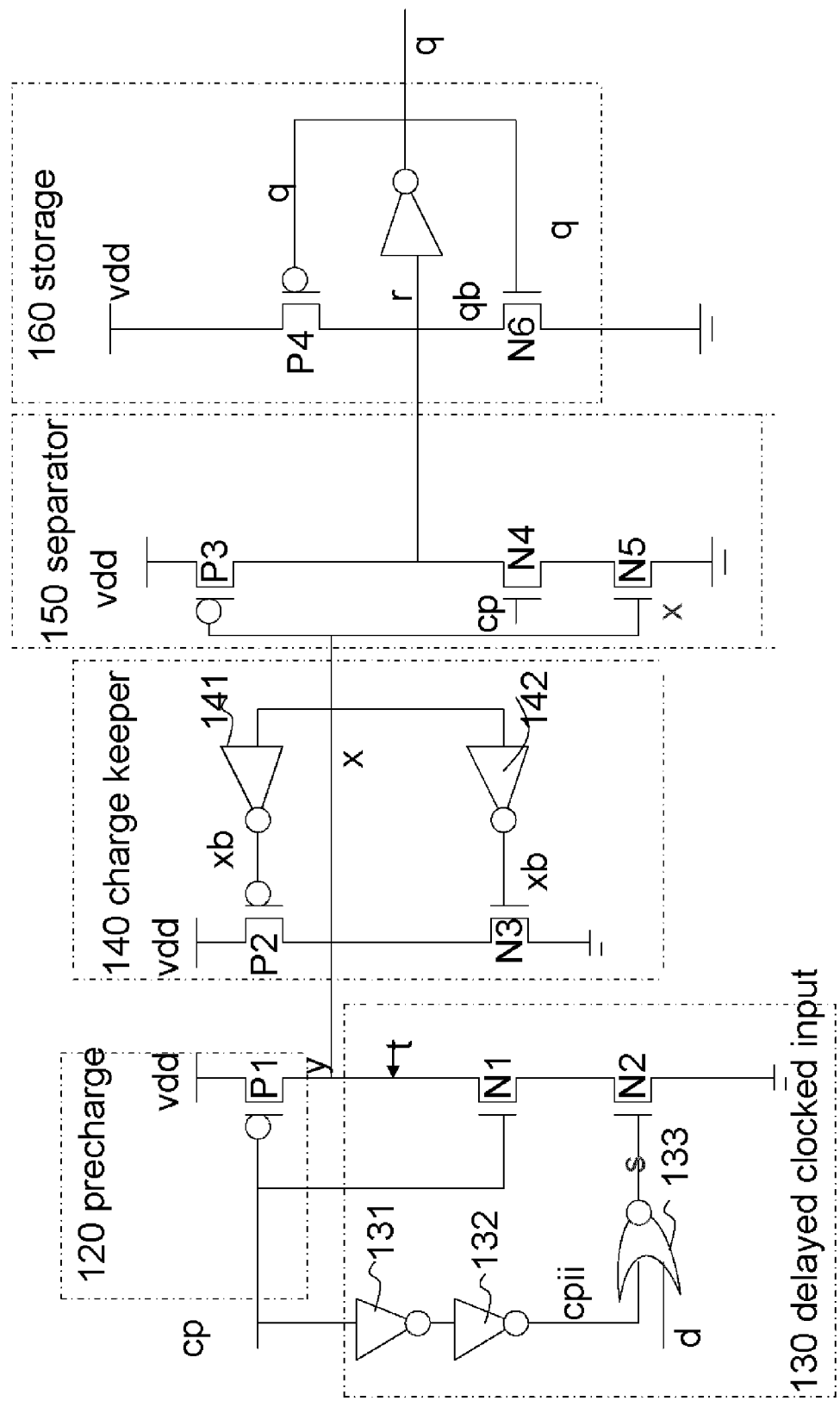
FIG. 3 depicts an illustrative embodiment of a flip-flop circuit with details of components comprising a pre-charge circuit, a delayed clocked input circuit, a charge keeper circuit, a separator circuit, and a storage circuit.

FIG. 3 demonstrates a detailed illustrative embodiment of the flip-flop circuit 100, where the components comprise a pre-charge circuit 120, a delayed clocked input circuit 130, a charge keeper circuit 140, a separator circuit 150, and a storage circuit 160, and each component is shown an illustrative implementation in logic circuits and transistors plus various signals.

The pre-charge circuit 120 in FIG. 3 comprises a pMOS transistor P1 with its gate coupled to the clock signal cp, a first terminal of P1 coupled to a supply voltage, and a second terminal of P1 coupled to the charged signal y. When the clock signal cp is LOW, P1 is switched on and the charged signal y would be equal to the Vdd, a logic 1.

The delayed clocked input circuit 130 in FIG. 3 comprises: a first nMOS transistor N1 with a first terminal coupled to the delayed clocked input controlled signal t, and a second terminal coupled to a first terminal of a second nMOS transistor N2; and a second terminal of N2 coupled to a ground signal. The gate of N1 is coupled to the clock signal, and the gate of N2 is coupled to a delayed input signal s generated by the clock signal delayed by two delay elements (inverters) 131, 132, and an input signal d feeding into an NOR gate 133.

When the clock signal cp is switching from LOW (logic 0) to HIGH (logic 1), the N1 transistor is switched on. At the mean time, the signal cpii is delayed by two inverters 131, 132, therefore cpii will remain LOW for a delay period caused by the delays of two inverters 131, 132, and then switch to HIGH. During the delay period when the signal cpii is still LOW, the input signal value d is inverted by the NOR gate 133 and generates a delayed input signal s with value equal to db, the complement value of the input signal d. When d has value 0, s=1, which turns on the transistor N2, leads the signal t has value 0. When d has value 1, s=0, and the transistor N2 is OFF, therefore the signal t keeps its previous value during the clock LOW period. Since the signal t is coupled to the charged signal y of the pre-charge circuit 120, therefore the signal t would have value HIGH (logic 1) during the clock LOW period. In summary, the signal t has the same value as the input signal d during the delay period caused by the delay elements 131, 132.

After the delay period, cpii will become HIGH, which will generate a value LOW (0) for the delayed input signal s, which in turn will switch off the N2 transistor. Therefore the signal t keeps the same value as the value during the delay period, which is the same value of the input signal d.

The charge keeper circuit 140 in FIG. 3 receives the charged signal y, the delayed clocked input controlled signal t, and generates the charge keeping signal x, which is coupled to y and t together. The signal x has value y when the clock cp is LOW and the pre-charge circuit 120 is charging the charged signal y. During the delay period caused by the inverters 131, 132 in the delayed clocked input circuit 130 in generating the signal cpii, the value of input signal d is complemented in generating the delayed input signal s. When d has value 0, s=1, and the signal t has value 0, which leads signal x to have value 0 as well. When d has value 1, s=0, and the transistor N2 is OFF, the signal x would keep whatever value x has maintained by the charge keeper circuit 140, which comprises: a pMOS transistor P2 with its gate coupled to the inverted charge keeping signal xb, a first terminal of P2 coupled to a supply voltage, and a second terminal of P2 coupled to the charged signal y; and an nMOS transistor N3 with its gate coupled to the inverted charge keeping signal xb, a first terminal of N3 coupled to the charged signal y, and a second terminal of N3 coupled to a ground signal.

The separator circuit 150 in FIG. 3 comprises: a pMOS transistor P3 with its gate coupled to the charge keeping signal x, a first terminal of P3 coupled to a supply voltage, and a second terminal of P3 coupled to the inverted charge keeping signal r; a first nMOS transistor N5 with its gate coupled to the charge keeping signal x, a first terminal of N5 coupled to a ground signal, and a second terminal of N5 coupled to a first terminal of a second nMOS transistor N4; and N4 with its gate coupled to the clock signal cp, a second terminal of N4 coupled to the inverted charge keeping signal r. When the clock signal cp is LOW, the charge keeping signal x is HIGH which turns off the transistor P3. Furthermore the LOW cp signal turns off the transistor N4 as well. Therefore there is no conducting path in the separator circuit 150, and the inverted charge keeping signal r will maintain whatever value it has. When the clock signal cp is HIGH, the separator circuit 150 becomes an inverter which inverts the value of the signal x and generates the inverted charge keeping signal r.

The storage circuit 160 in FIG. 3 comprises: a pMOS transistor P4 with its gate coupled to a present state signal q, a first terminal of P4 coupled to a supply voltage, and a second terminal of P4 coupled to the inverted charge keeping signal r; an nMOS transistor N6 with its gate coupled to the present state signal, a first terminal of N6 coupled to a ground signal, and a second terminal of N6 coupled to the inverted charge keeping signal r; and an inverter configured to receive the inverted charge keeping signal r and generating the present state signal q.

For the illustrative embodiment in FIG. 3, when the clock signal cp is LOW, the transistor P1 is ON, the charged signal y and the charge keeping signal x are HIGH which turns off the transistor P3. Furthermore the LOW cp signal turns off the transistor N4 as well. Therefore there is no conducting path in the separator circuit 150, and the inverted charge keeping signal r will maintain whatever value it has, which is the inverted value of the present state signal q. When q is LOW (0), it turns on the transistor P4, and r becomes 1. When q is HIGH (1), it turns on the transistor N6, and r becomes 0.

For the illustrative embodiment in FIG. 3, when the clock signal cp is HIGH, the pre-charge circuit 120 is turned off. For the delayed clocked input circuit 130, during a delay period caused by the delay elements (two inverters in the current embodiment 131, 132), the delayed input signal s has a complement value of the input signal d. When d is 1, s has value 0, which turns off the N2 transistor, and the delayed clocked input circuit 130 does not conduct. Therefore the charge keeping signal x which is connected to the charged signal y and the signal t will keep the HIGH value received from the clock LOW phase, therefore x has value 1 which is equal to the input signal d value. When d is 0, s has value 1, which turns on the N2 transistor, and the delayed clocked input circuit 130 produce a 0 output at signal t. Therefore the charge keeping signal x which is connected to the signal t will become 0 which is equal to the input signal d value. Therefore during the delay period of the delayed clocked input circuit 130, the charge keeping signal x and the delayed clocked input controlled signal t have the same value of input signal d.

For the illustrative embodiment in FIG. 3, when the clock signal cp is HIGH, the pre-charge circuit 120 is turned off. For the delayed clocked input circuit 130, after a delay period caused by the delay elements (two inverters in the current embodiment 131, 132), the delayed input signal s becomes 0 since the signal cpii becomes 1, which turns off the transistor N2. Therefore the charge keeper circuit 140 will maintain whatever value the charge keeping signal x has, which is determined by d during the delay period of the delayed clocked input circuit.

For the illustrative embodiment in FIG. 3, when the clock signal cp is HIGH, the charge keeping signal x will have the same value as the input signal d. Furthermore, the HIGH cp signal turns the separator circuit 150 into an inverter, and the inverted charge keeping signal r will have the complement value of x, which equals to the complement value of d. The present state signal q in the storage circuit 160 has the complement value of r, which equals to the value of d and x. The signal qb is the inverted present state signal.

FIG. 3 is a mere illustrative embodiment of the flip-flop circuit 100. Each of the components 120, 130, 140, 150, and 160 could have different embodiments, which will not change the function of the overall circuit 100. Some more illustrative embodiments are presented in the following. These embodiments are only for illustrative purpose, and do not impose any limitations on any other possible embodiments not presented. Those skilled in the art can readily recognize there are still many possible embodiments for the flip-flop circuit 100 in addition to those listed in the current description.

Figure 4C:
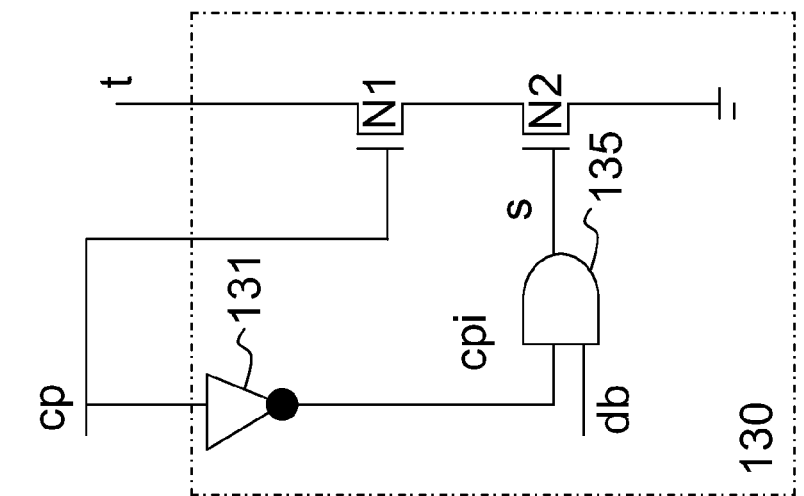
Figure 4B:
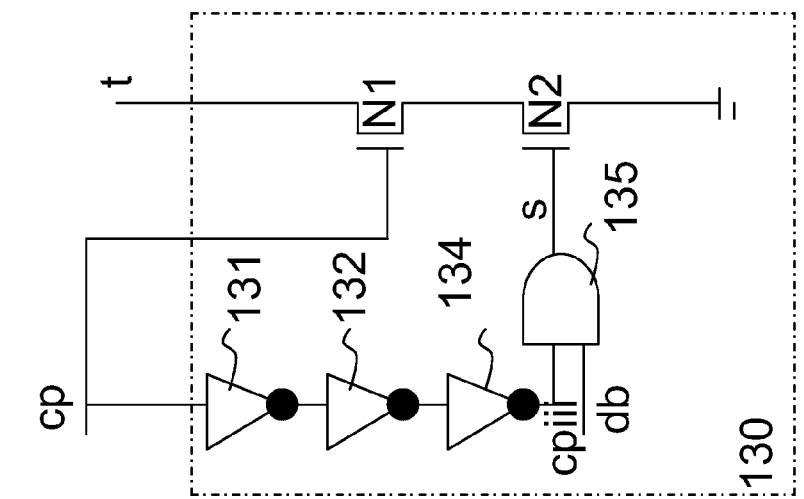
Figure 4A:
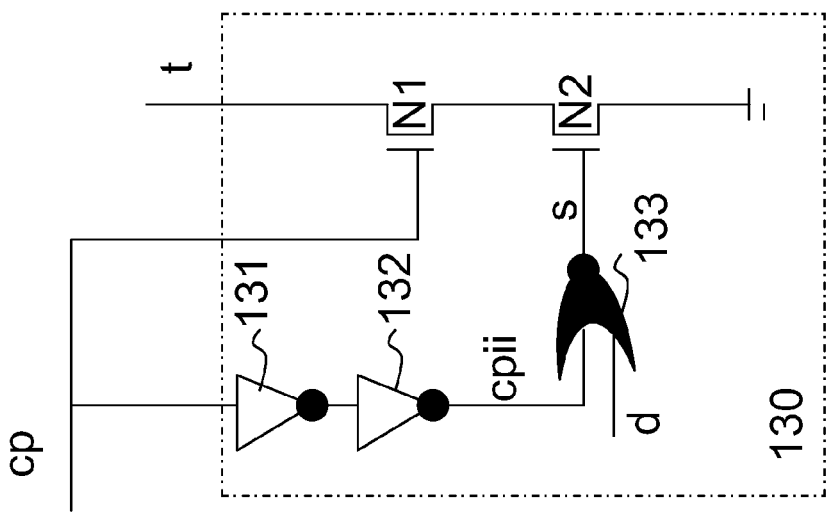

FIG. 4 presents six different illustrative embodiments of the delayed clocked input circuit 130. The embodiment in FIG. 4(*a*) is the one presented in FIG. 3. FIG. 4(*a*) can be changed to other forms of logic circuits with an equivalent function. For example, the two delay inverters 131, 132 coupled to an NOR gate 133 can be converted to three delay inverters 131, 132, 134 coupled to an AND gate 135, with the input signal d changed to the inverted input signal db, as shown in FIG. 4(*b*). The 130 circuit can be further changed to a circuit showing in FIG. 4(*c*) where only one delay inverter 131 is used to connect to an AND gate 135. In addition, the gate controls for the transistor N1 and N2 can be interchanged as well. For the three 130 circuits shown in FIGS. 4(*a*), (*b*), and (*c*), FIGS. 4(*d*), (*e*), and (*f*) are analogous circuits obtained by interchanging the gate control of the transistors N1 and N2.

FIG. 5 presents four different illustrative embodiments of the charge keeper circuit 140. The circuit in FIG. 5(*a*) is the one presented in FIG. 3 for the charge keeper circuit 140. Instead of using two inverters 141, 142 as in FIG. 5(*a*), FIG. 5(*b*) uses only one inverter 141 and reuses the xb signal generated by the inverter. Furthermore, in FIG. 5(*c*), the charge keeper circuit can have an additional nMOS transistor N7 controlled by the clock signal cp. When the clock signal cp is LOW, the charge keeping signal x has the same value as the charged signal y of the pre-charge circuit 120, which is 1. The signal x loops around the inverter and the P2 transistor to maintain the 1 value, while the nMOS transistor N7 cuts off the path in the nMOS part. When the clock signal cp is HIGH, the transistor N7 is ON, and the charge keeper circuit 140 functions as before without the transistor N7. FIG. 5(*d*) shows an embodiment where the signal xb is reused.

FIG. 6 presents four different illustrative embodiments of the storage circuit 160. The circuit in FIG. 6(*a*) is the one presented in FIG. 3 for the storage circuit 160. Similarly as for the charge keeper circuit in FIG. 5, clock signal cp controlled pMOS transistor P5 can be added to the storage circuit 160 shown in FIG. 6(*b*), (*c*), and (*d*), and the charge keeping signal x controlled nMOS transistor N7 can be added to the storage circuit 160, shown in FIGS. 6(*c*) and (*d*). Furthermore, the gate control signals for P4 and P5 can be interchanged, shown in FIGS. 6(*c*) and (*d*).

Figure 7:
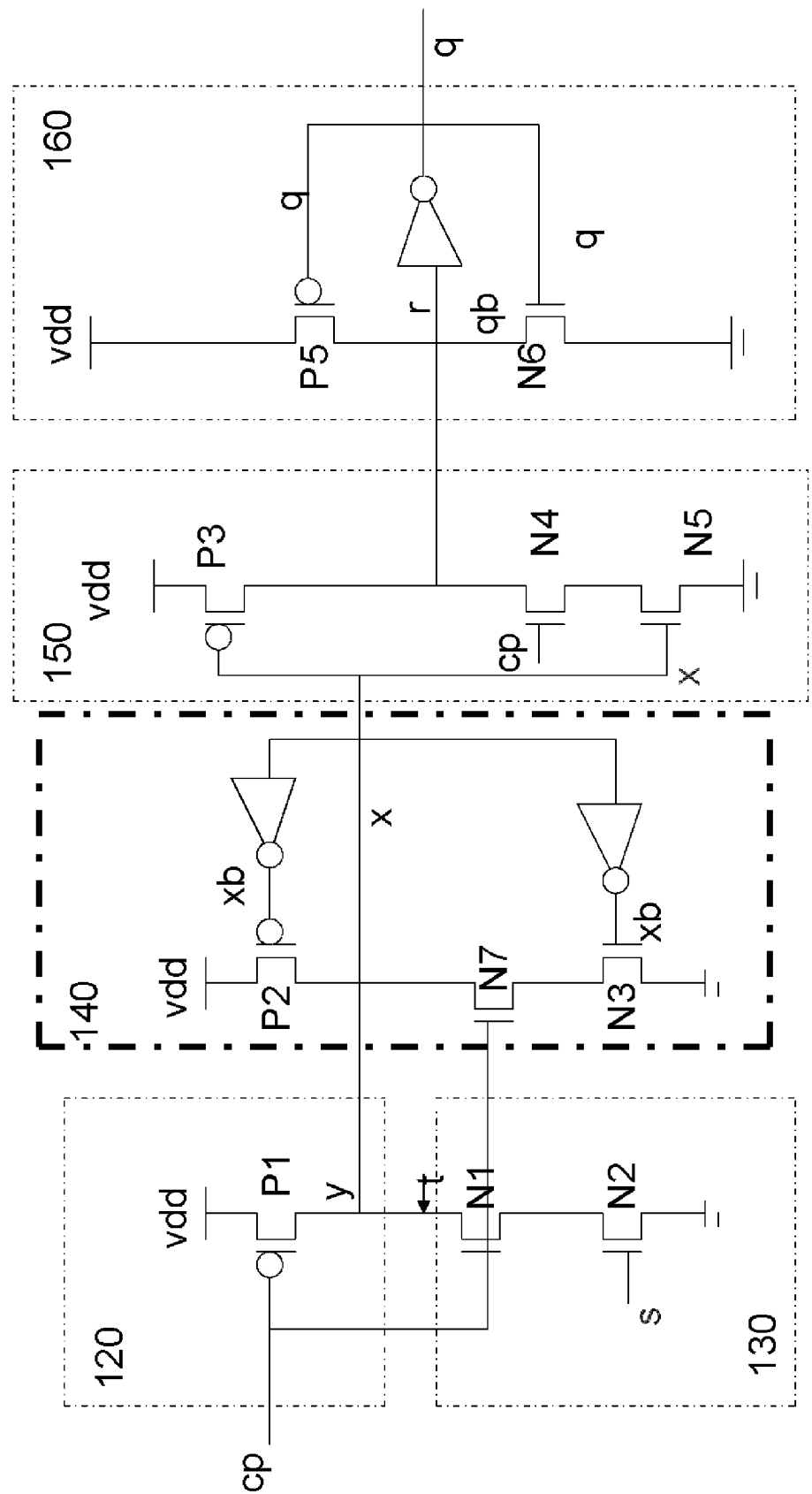
FIG. 7 depicts another illustrative embodiment of a flip-flop circuit.
Figure 8:
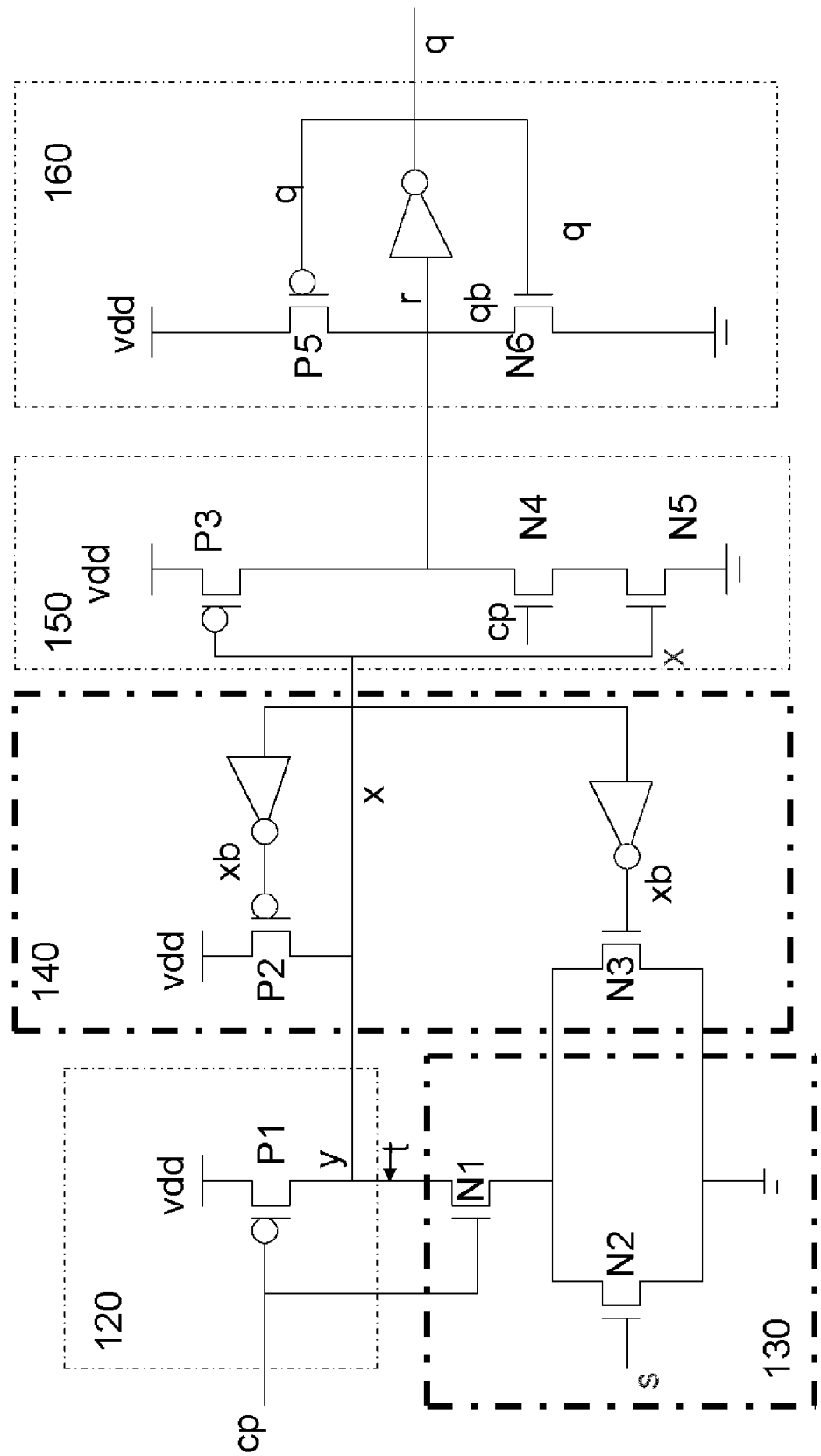
FIG. 8 depicts another illustrative embodiment of a flip-flop circuit.

FIG. 7 illustrates an illustrative embodiment of the flip-flop circuit 100 where the charge keeper circuit 140 is the circuit shown in FIG. 5(*c*) and the delayed clocked input circuit 130 can be any of the circuits shown in FIG. 4(*a*), (*b*), or (*c*). The transistors N1 and N7 in FIG. 7 are both gate controlled by the clock signal cp. Therefore these two transistors can be merged into one, resulting in an embodiment shown in FIG. 8.

Figure 9:
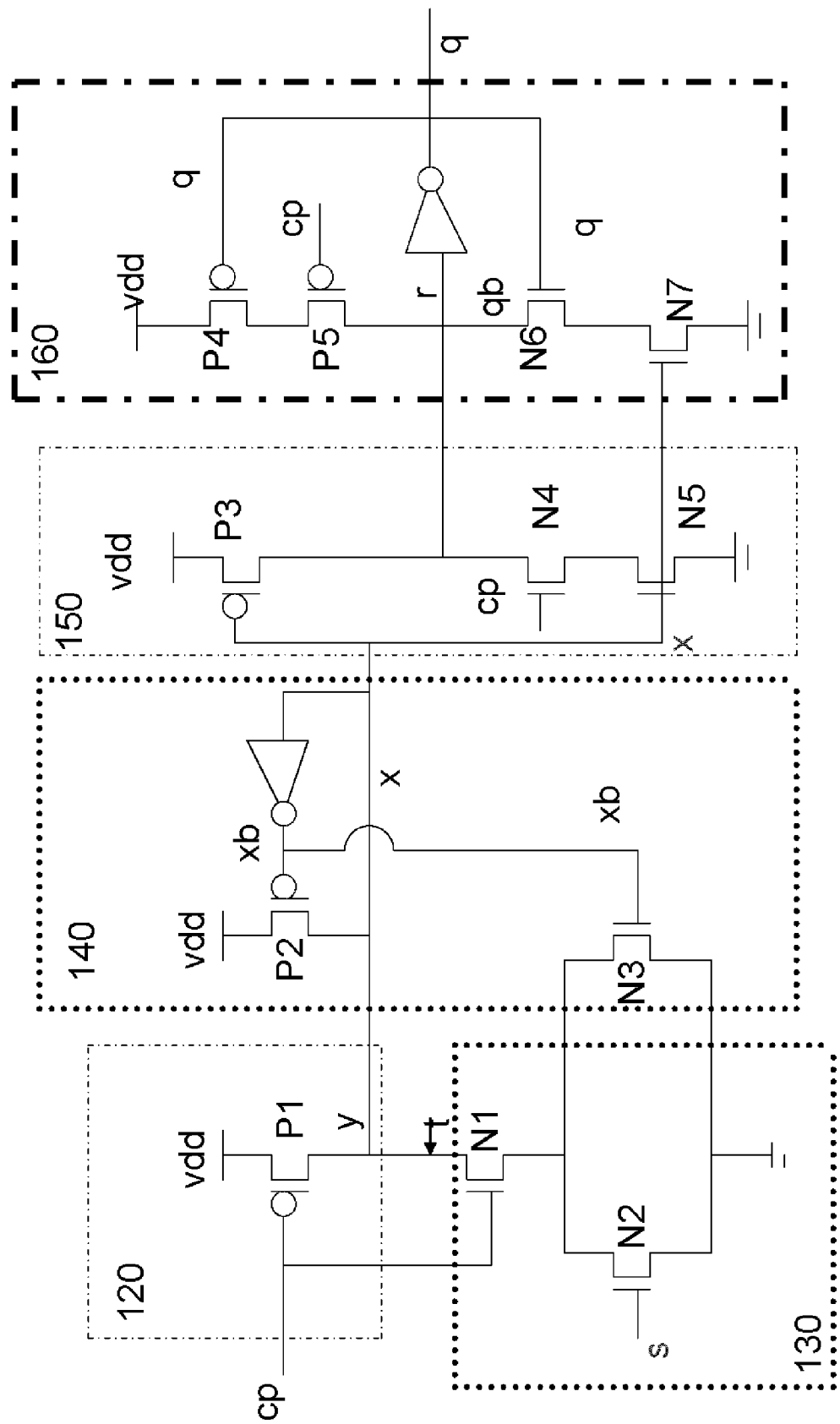
FIG. 9 depicts another illustrative embodiment of a flip-flop circuit.
Figure 10:
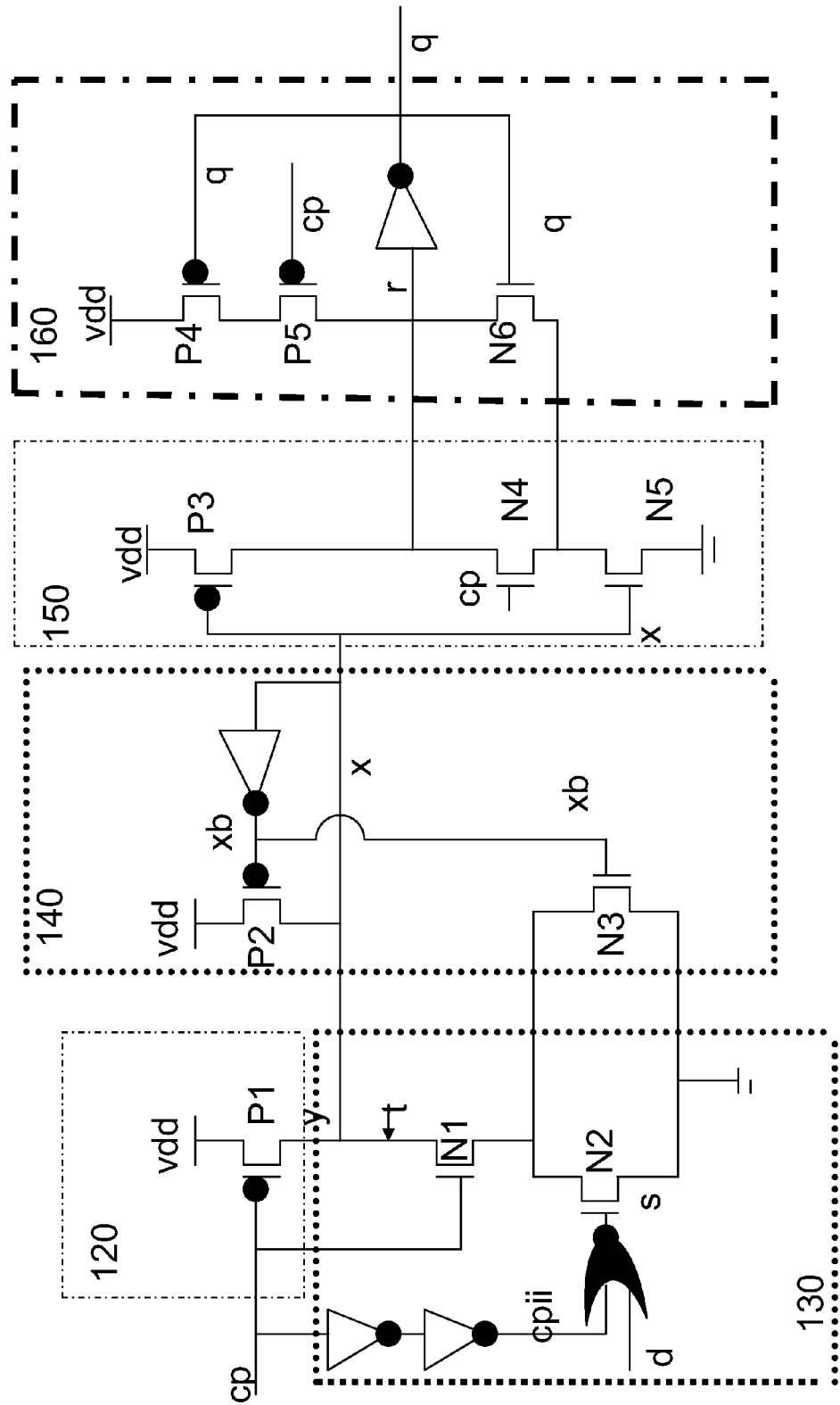
FIG. 10 depicts another illustrative embodiment of a flip-flop circuit.

FIG. 9 illustrates an illustrative embodiment of the flip-flop circuit 100 where the storage circuit 160 is the circuit shown in FIG. 6(*d*). The transistors N5 and N7 in FIG. 9 are both gate controlled by the charge keeping signal x. Therefore these two transistors can be merged into one, resulting in an embodiment shown in FIG. 10.

The flip-flop circuit 100 can be disposed in currently available technology such as in a semiconductor device or on a printed circuit board. The flip-flop circuit 100 can be disposed in future available technology as well.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A flip-flop circuit comprising:
a pre-charge circuit configured to receive a clock signal and configured to generate a charged signal, wherein the charged signal is HIGH when the clock is LOW;
a delayed clocked input circuit configured to connect to the clock signal, and an input signal and configured to selectively generate a delayed clocked input controlled signal with the same value as the input signal when the clock is HIGH;
a charge keeper circuit configured to receive the charged signal, and the delayed clocked input controlled signal and configured to generate a charge keeping signal, wherein the charge keeping signal is coupled to the charged signal and the delayed clocked input controlled signal, has the same value as the charged signal when the clock is LOW, and has the same value as the delayed clocked input controlled signal when the clock is HIGH;

a separator circuit configured to receive the charge keeping signal, the clock signal, and configured to selectively generate an inverted charge keeping signal; and a storage circuit configured to selectively receive the inverted charge keeping signal, a present state signal, and configured to generate the present state signal.

2. The flip-flop circuit of claim 1, wherein the pre-charge circuit further comprises:

a pMOS transistor with its gate coupled to the clock signal, a first terminal of the pMOS transistor coupled to a supply voltage, and a second terminal of the pMOS transistor coupled to the charged signal.

3. The flip-flop circuit of claim 1, wherein the separator circuit further comprises:

a pMOS transistor with its gate coupled to the charge keeping signal, a first terminal of the pMOS transistor coupled to a supply voltage, and a second terminal of the pMOS transistor coupled to the inverted charge keeping signal;

a first nMOS transistor with its gate coupled to the charge keeping signal, a first terminal of the first nMOS transistor coupled to a ground signal, and a second terminal of the first nMOS transistor coupled to a first terminal of a second nMOS transistor; and the second nMOS transistor with its gate coupled to the clock signal, a second terminal of the second nMOS transistor coupled to the inverted charge keeping signal.

4. The flip-flop circuit of claim 1, wherein the delayed clocked input circuit further comprises:

a first nMOS transistor with a first terminal coupled to the delayed clocked input controlled signal, and a second terminal coupled to a first terminal of a second nMOS transistor; and a second terminal of the second nMOS transistor coupled to a ground signal; and the gate of one of the first and the second nMOS transistors is coupled to the clock signal, and the gate of the remaining nMOS transistor is coupled to a delayed input signal generated by the clock signal delayed by at least one delay element and an input signal, wherein the delayed input signal has a complement value of the input signal during a delay period.

5. The flip-flop circuit of claim 1, wherein the charge keeper circuit further comprises:

a pMOS transistor with its gate coupled to an inverted charge keeping signal, a first terminal of the pMOS transistor coupled to a supply voltage, and a second terminal of the pMOS transistor coupled to the charged signal; and an nMOS transistor with its gate coupled to an inverted charge keeping signal, a first terminal of the nMOS transistor coupled to the charged signal, and a second terminal of the nMOS transistor coupled to a ground signal;

wherein the charge keeping signal is coupled to the charged signal.

6. The flip-flop circuit of claim 1, wherein the charge keeper circuit further comprises:

the charge keeper circuit is further configured to receive the clock signal;

a pMOS transistor with its gate coupled to the inverted charged signal, a first terminal of the pMOS transistor coupled to a supply voltage, and a second terminal of the pMOS transistor coupled to the charged signal;

a first nMOS transistor with its gate coupled to the clock signal, a first terminal of the first nMOS transistor coupled to the charged signal, and a second terminal of the first nMOS transistor coupled to a first terminal of a second nMOS transistor; and the second nMOS transistor with its gate coupled to the inverted charged signal, and a second terminal of the second nMOS transistor coupled to a ground signal.

7. The flip-flop circuit of claim 1, wherein the storage circuit further comprises:

a pMOS transistor with its gate coupled to the present state signal, a first terminal of the pMOS transistor coupled to a supply voltage, and a second terminal of the pMOS transistor coupled to the inverted charge keeping signal;

an nMOS transistor with its gate coupled to the present state signal, a first terminal of the nMOS transistor coupled to a ground signal, and a second terminal of the nMOS transistor coupled to the inverted charge keeping signal; and an inverter configured to receive the inverted charge keeping signal and generating the present state signal.

8. The flip-flop circuit of claim 1, wherein the storage circuit further comprises:

the storage circuit is further configured to receive the clock signal;

a first pMOS transistor with its gate coupled to the clock signal, a first terminal of the first pMOS transistor coupled to a supply voltage, and a second terminal of the first pMOS transistor coupled to a first terminal of a second pMOS transistor;

the second pMOS transistor with its gate coupled to the present state signal, and a second terminal of the second pMOS transistor coupled to the inverted charge keeping signal;

an nMOS transistor with its gate coupled to the present state signal, a first terminal of the first nMOS transistor coupled to the inverted charge keeping signal, and a second terminal of the first nMOS transistor coupled to a ground signal; and an inverter configured to receive the inverted charge keeping signal and generating the present state signal.

9. The flip-flop circuit of claim 1, wherein the storage circuit further comprises:

the storage circuit is further configured to receive the clock signal and the charge keeping signal;

a first pMOS transistor with its first terminal coupled to a supply voltage, its second terminal coupled to a first terminal of a second pMOS transistor, and a second terminal of the second pMOS transistor coupled to the inverted charge keeping signal;

the gate of one of the first and the second pMOS transistors is coupled to the clock signal and the gate of the remaining pMOS transistor is coupled to the present state signal;

a first nMOS transistor with its first terminal coupled to the inverted charge keeping signal, its second terminal coupled to a first terminal of a second nMOS transistor, and a second terminal of the second nMOS transistor coupled to a ground signal;

the gate of one of the first and the second nMOS transistors is coupled to the present state signal and the gate of the remaining nMOS transistor is coupled to the charge keeping signal; and an inverter configured to receive the inverted charge keeping signal and generating the present state signal.

10. The flip-flop circuit of claim 1, wherein the delayed clocked input circuit further comprises:
a first nMOS transistor with its gate coupled to a delayed input signal generated by the clock signal delayed by at least one delay elements and an input signal, wherein the delayed input signal has a complement value of the input signal during a delay period, a first terminal of the first nMOS transistor coupled to a ground signal, and a second terminal of the first nMOS transistor coupled to a first terminal of a second nMOS transistor; and
the second nMOS transistor with its gate coupled to the clock signal, and a second terminal of the second nMOS transistor coupled to the delayed clocked input controlled signal; and
wherein the charge keeper circuit further comprises:
a pMOS transistor with its gate coupled to the inverted charged signal, a first terminal of the pMOS transistor coupled to a supply voltage, and a second terminal of the pMOS transistor coupled to the charged signal;
a third nMOS transistor with its gate coupled to the inverted charged signal, a first terminal of the third nMOS transistor coupled to the ground signal, and a second terminal of the third nMOS transistor coupled to the first terminal of the second nMOS transistor in the delayed clocked input circuit.

11. The flip-flop circuit of claim 3, wherein the storage circuit further comprises:
a first pMOS transistor with its first terminal coupled to a supply voltage, its second terminal coupled to a first terminal of a second pMOS transistor, and a second terminal of the second pMOS transistor coupled to the inverted charge keeping signal;
the gate of one of the first and the second pMOS transistors is coupled to the clock signal and the gate of the remaining pMOS transistor is coupled to the present state signal;
a third nMOS transistor with its gate coupled to the present state signal, a first terminal of the third nMOS transistor coupled to the inverted charge keeping signal, and a second terminal of the third nMOS transistor coupled to the second terminal of the first nMOS transistor in the separate circuit; and
an inverter configured to receive the inverted charge keeping signal and generating the present state signal.

12. The flip-flop circuit of claim 1, wherein the flip-flop is disposed in a semiconductor device.

13. The flip-flop circuit of claim 1, wherein the flip-flop is disposed on a printed circuit board.

14. A method of operating a flip-flop circuit comprising:
generating a charged signal by a pre-charge circuit configured to receive the clock signal, wherein the charged signal is HIGH when the clock is LOW;
selectively generating a delayed clocked input controlled signal by a delayed clocked input circuit configured to receive the clock signal, and an input signal, wherein the delayed clocked input controlled signal has the same value as the input signal when the clock is HIGH;
generating a charge keeping signal by a charge keeper circuit configured to receive the charged signal and the delayed clocked input controlled signal, wherein the charge keeping signal is coupled to the charged signal and the delayed clocked input controlled signal, has the same value as the charged signal when the clock is LOW, and has the same value as the delayed clocked input controlled signal when the clock is HIGH;
selectively generating an inverted charge keeping signal by a separator circuit configured to receive the charge keeping signal and the clock signal; and
generating a present state signal by a storage circuit configured to selectively receive the inverted charge keeping signal, and the present state signal.

15. The method as claimed in claim 14 further comprising generating the charged signal by the pre-charge circuit,
wherein the pre-charge circuit comprising: a pMOS transistor with its gate coupled to the clock signal, a first terminal of the pMOS transistor coupled to a supply voltage, and a second terminal of the pMOS transistor coupled to the charged signal.

16. The method as claimed in claim 14 further comprising generating the inverted charge keeping signal by the separator circuit,
wherein the separator circuit further comprises:
a pMOS transistor with its gate coupled to the charge keeping signal, a first terminal of the pMOS transistor coupled to a supply voltage, and a second terminal of the pMOS transistor coupled to the inverted charge keeping signal;
a first nMOS transistor with its gate coupled to the charge keeping signal, a first terminal of the first nMOS transistor coupled to a ground signal, and a second terminal of the first nMOS transistor coupled to a first terminal of a second nMOS transistor; and
the second nMOS transistor with its gate coupled to the clock signal, a second terminal of the second nMOS transistor coupled to the inverted charge keeping signal.

17. The method as claimed in claim 14 further comprising generating the delayed clocked input controlled signal by the delayed clocked input circuit, wherein the delayed clocked input circuit further comprises:
a first nMOS transistor with a first terminal coupled to the delayed clocked input controlled signal, and a second terminal coupled to a first terminal of a second nMOS transistor; and a second terminal of the second nMOS transistor coupled to a ground signal; and
the gate of one of the first and the second nMOS transistors is coupled to the clock signal, and the gate of the remaining nMOS transistor is coupled to a delayed input signal generated by the clock signal delayed by at least one delay element and an input signal, wherein the delayed input signal has a complement value of the input signal during a delay period.

18. The method as claimed in claim 14 further comprising generating the charge keeping signal by the charge keeper circuit, wherein the charge keeper circuit further comprises:
a pMOS transistor with its gate coupled to the inverted charged signal, a first terminal of the pMOS transistor coupled to a supply voltage, and a second terminal of the pMOS transistor coupled to both the charged signal and the charge keeping signal; and
an nMOS transistor with its gate coupled to the inverted charged signal, a first terminal of the nMOS transistor coupled to the charged signal, and a second terminal of the nMOS transistor coupled to a ground signal.

19. The method as claimed in claim 14 further comprising generating the charge keeping signal by the charge keeper circuit, wherein the charge keeper circuit further comprises:
the charge keeper circuit is further configured to receive the clock signal;
a pMOS transistor with its gate coupled to the inverted charged signal, a first terminal of the pMOS transistor coupled to a supply voltage, and a second terminal of the pMOS transistor coupled to the charged signal;

a first nMOS transistor with its gate coupled to the clock signal, a first terminal of the first nMOS transistor coupled to the charged signal, and a second terminal of the first nMOS transistor coupled to a first terminal of a second nMOS transistor; and the second nMOS transistor with its gate coupled to the inverted charged signal, and a second terminal of the second nMOS transistor coupled to a ground signal.

20. The method as claimed in claim 14 further comprising generating the present state signal by the storage circuit, wherein the storage circuit further comprises:

a pMOS transistor with its gate coupled to the present state signal, a first terminal of the pMOS transistor coupled to a supply voltage, and a second terminal of the pMOS transistor coupled to the inverted charge keeping signal;

an nMOS transistor with its gate coupled to the present state signal, a first terminal of the nMOS transistor coupled to a ground signal, and a second terminal of the nMOS transistor coupled to the inverted charge keeping signal; and an inverter configured to receive the inverted charge keeping signal and generating the present state signal.

21. The method as claimed in claim 14 further comprising generating the present state signal by the storage circuit, wherein the storage circuit further comprises:

the storage circuit is further configured to receive the clock signal;

a first pMOS transistor with its gate coupled to the clock signal, a first terminal of the first pMOS transistor coupled to a supply voltage, and a second terminal of the first pMOS transistor coupled to a first terminal of a second pMOS transistor;

the second pMOS transistor with its gate coupled to the present state signal, and a second terminal of the second pMOS transistor coupled to the inverted charge keeping signal;

an nMOS transistor with its gate coupled to the present state signal, a first terminal of the first nMOS transistor coupled to the inverted charge keeping signal, and a second terminal of the first nMOS transistor coupled to a ground signal; and an inverter configured to receive the inverted charge keeping signal and generating the present state signal.

22. The method as claimed in claim 14 further comprising generating the present state signal by the storage circuit, wherein the storage circuit further comprises:

the storage circuit is further configured to receive the clock signal and the charge keeping signal;

a first pMOS transistor with its first terminal coupled to a supply voltage, its second terminal coupled to a first terminal of a second pMOS transistor, and a second terminal of the second pMOS transistor coupled to the inverted charge keeping signal;

the gate of one of the first and the second pMOS transistors is coupled to the clock signal and the gate of the remaining pMOS transistor is coupled to the present state signal;

a first nMOS transistor with its first terminal coupled to the inverted charge keeping signal, its second terminal coupled to a first terminal of a second nMOS transistor, and a second terminal of the second nMOS transistor coupled to a ground signal;

the gate of one of the first and the second nMOS transistors is coupled to the present state signal and the gate of the remaining nMOS transistor is coupled to the charge keeping signal; and an inverter configured to receive the inverted charge keeping signal and generating the present state signal.

* * * * *